United States Patent [19]

Russell

[11] 4,105,965

[45] Aug. 8, 1978

[54] STATIC TRIP CIRCUIT BREAKER TEST SET

[75] Inventor: Ronald R. Russell, Plainville, Conn.

[73] Assignee: General Electric Company, New York, N.Y.

[21] Appl. No.: 815,628

[22] Filed: Jul. 14, 1977

[51] Int. Cl.² .......................................... G01R 31/02
[52] U.S. Cl. ................................ 324/28 CB; 361/94; 361/44
[58] Field of Search ....................... 324/28 R, 28 CB; 361/44, 93, 94, 95

[56] References Cited

U.S. PATENT DOCUMENTS

| 3,373,350 | 3/1968 | Reece | 324/28 CB |
| 3,532,967 | 10/1970 | Milton et al. | 324/28 CB |
| 3,646,438 | 2/1972 | Staff | 324/28 CB |

Primary Examiner—M. Tokar

Attorney, Agent, or Firm—Robert A. Cahill; Walter C. Bernkopf; Frank L. Neuhauser

[57] ABSTRACT

A field test set for static trip circuit breakers is electrically connected to the static trip unit and to the circuit breaker trip coil and phase current sensor transformers. The test set, powered from a low voltage source, is equipped to shunt feed the trip unit power supply, bringing the trip unit up to power preparatory to the injection of selected levels of overcurrent and ground fault simulating test signal current for verifying the time-current characteristics and current pickup calibrations of the various trip functions of the trip unit. A lockout circuit automatically terminates a test signal current whose magnitude and duration represents potential harm to the trip unit. The test set is also equipped to test the trip coil energization level developed by the trip unit and also the continuity of the breaker current transformers.

17 Claims, 5 Drawing Figures

STATIC TRIP CIRCUIT BREAKER TEST SET

BACKGROUND OF THE INVENTION

Modern circuit protection increasingly calls for circuit breakers equipped with so-called "static" or electronic trip units in lieu of the traditional thermal-magnetic or dual magnetic trip units for achieving automatic opening of the breaker contacts in response to overcurrent conditions ranging from light overload to heavy short circuit. Static trip units are found to be more versatile and precise in terms of selectively establishing multiple overcurrent pickup levels and trip time delays. For example, currently available static trip units have the capability of selectively establishing coordinated long time delay, short time delay and instantaneous overcurrent pickup levels, as well as different tolerance bands of time delays. As a consequence, the trip settings of a static trip circuit breaker can be readily tailored to the load so as to provide proper protection and yet avoid vexations nuisance tripping.

Another reason for the current popularity of static trip circuit breakers is the increasing demand for ground fault protection. Since response to a ground fault condition is best handled electronically, it becomes quite practical to integrate the ground fault trip function into an overcurrent responsive electronic trip unit in contrast to providing an electronic ground fault trip unit plus a traditional electromechanical trip unit.

Once a static trip circuit breaker goes into the field, it is desirable to verify its continuing capability to provide the full measure of circuit protection intended for a particular application. To this end, field test sets of two types are available. In one type of test set, a high current of overcurrent proportions is passed through each of the breaker poles, to verify that the breaker will trip. In the second type, low current, fault simulating signals are injected into the secondary circuits of the breaker phase current monitoring transformers which are connected as inputs to the static trip unit. If the trip unit is functioning properly, it will process these fault simulating signals pursuant to initiating a trip function as though corresponding high currents of overcurrent proportions actually flowed through the breaker poles, i.e., the primaries of the breaker current transformers.

SUMMARY OF THE INVENTION

In accordance with the present invention, there is provided an improved field test set for static trip circuit breakers which is adapted to inject low current, fault simulating signals directly into the breaker static trip unit. To implement the test set, the circuit breaker is removed from service and the normal electrical connection between the static trip unit and the breaker current transformers and trip coil is disconnected and then reconnected to the test set in a manner such that the latter is electrically interposed in series between the trip unit and the breaker. Whereas in service the trip unit is self-powered in that it derives operating power from the circuit being protected via the breaker current transformers, during testing, the test set, which can be plugged into any conventional low voltage convenience outlet, is equipped to supply trip unit operating power. More specifically, the trip power supply is directly shunt fed from the test set, thereby rapidly bringing the power supply up to nominal voltage prior to the injection of a fault simulating test current signal. Since, in accordance with the present invention, the test signal current is not required to have the energy to power the trip unit power supply, the signal voltage can be quite low, and the power requirements of the test set are thereby minimized.

Prior to an actual test, a preliminary fault signal current is injected into the trip unit and its magnitude is preset to the desired test level as observed from a digital meter included in the test set. To initiate a test, a start switch is closed and the trip unit power supply is abruptly brought up to nominal voltage under the control of test set logic circuitry. The preset simulated fault signal is then injected into the trip unit and the time required for the trip unit to initiate a trip function by applying energizing current to the breaker coil circuit is recorded on an elapsed time meter. This energizing current can be routed either to the breaker trip coil and back to the test set, in which the breaker is tripped or solely to the test set. In either case, the trip coil energizing current developed by the trip unit is measured by the test set to determine if it is of nominal magnitude. Test set selector switches serve to selectively route the test signal current to the various phase current signal inputs or to the ground fault signal input of the breaker trip unit.

A lockout circuit operates automatically to disable the test set and thus protect the trip unit from prolonged or continuous testing at high simulated fault (test) signal current levels. Lockout, once initiated, is continued for a predetermined time period to afford ample recovery time for the trip unit circuitry.

As an additional feature of the invention, a current transformer continuity check circuit is included in the test set. Current is routed through each current transformer secondary in sequence, and the voltage drops thereacross are monitored. In each case, if the voltage drop remains minimal, an indication of passage of the continuity check is given.

The invention accordingly comprises the features of construction and arrangement of parts will be exemplified in the construction hereinafter set forth, and the scope of the invention will be indicated in the claims.

For a better understanding of the nature and objects of the invention, reference should be had to the following detailed description taken in conjunction with the accompanying drawings, in which:

FIG. 1 is a simplified circuit diagram, partially in block form, of the trip unit of FIG. 1;

Like reference numerals refer to corresponding parts throughout the several views of the drawings.

DETAILED DESCRIPTION

Figure 1:
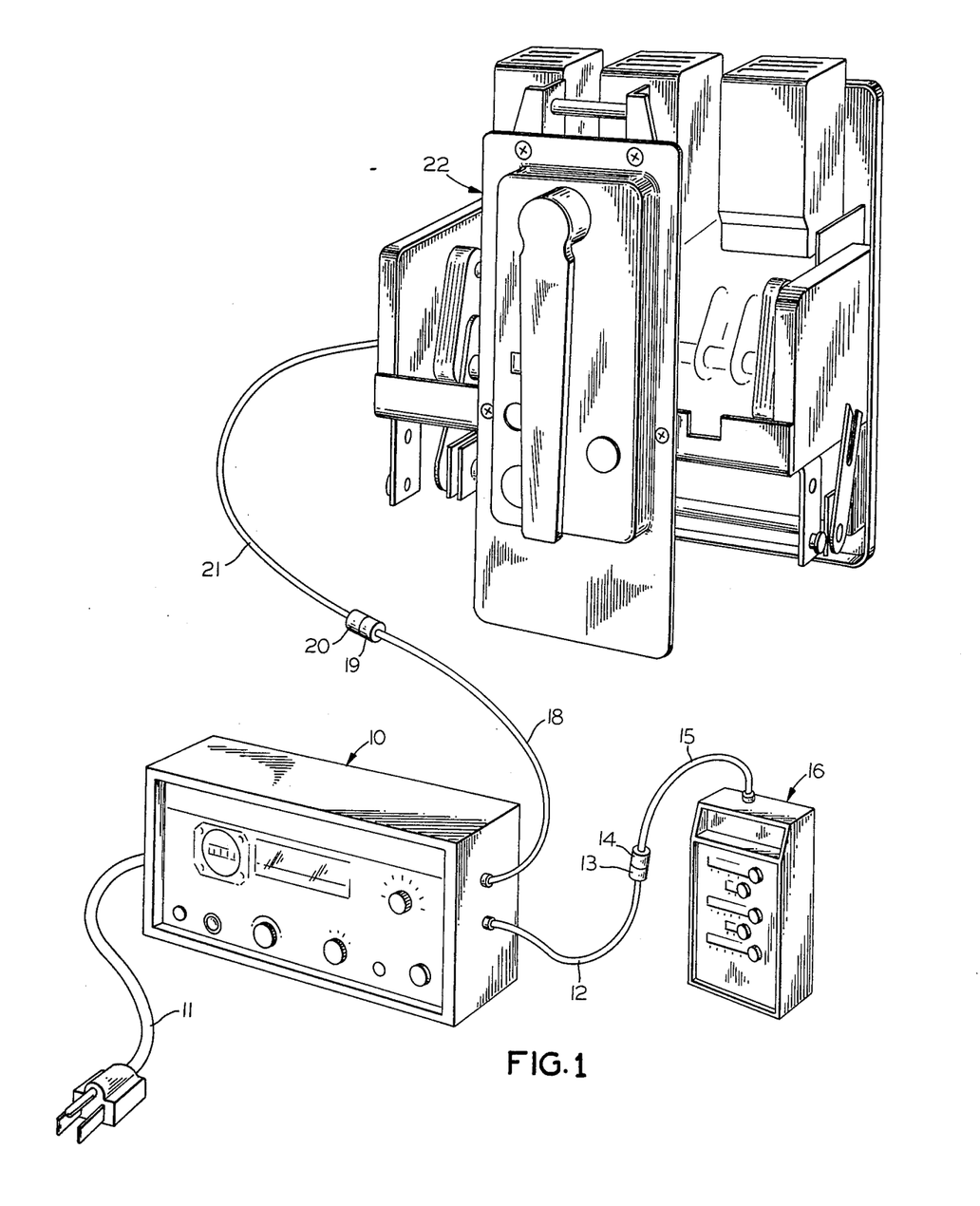
FIG. 1 is a simplified perspective view illustrating the manner in which the field test set of the present invention is electrically connected to the static trip unit and to the circuit breaker pursuant to conducting a field test verifying the operability of the static trip circuit breaker.

The static trip circuit breaker field test set of the present invention, generally indicated at 10 in FIG. 1, is equipped with a power cord 11 adapted to tap electrical power from a conventional 120 voltage AC source.

Emanating from the test set is a multi-conductor cable 12 terminating in a connector 13 fashioned to make electrical connection with a connector 14 at the end of a cable harness 15 leading from a static trip unit, generally indicated at 16. A second multi-conductor test set cable 18 terminates in an electrical connector 19 fashioned to make electrical connection with a connector 20 terminating a cable harness 21 emanating from a static trip circuit breaker, generally indicated at 22. It will be appreciated that when the circuit breaker is in service, connector 20 of its cable harness 21 is electrically mated with connector 14 of the trip unit cable harness 15, and the latter physically mounted to the circuit breaker. However, when test set 10 is implemented to test the operability of the static trip breaker, it is effectively electrically interposed in series between circuit breaker 22 and trip unit 16, as depicted in FIG. 1.

Figure 2:
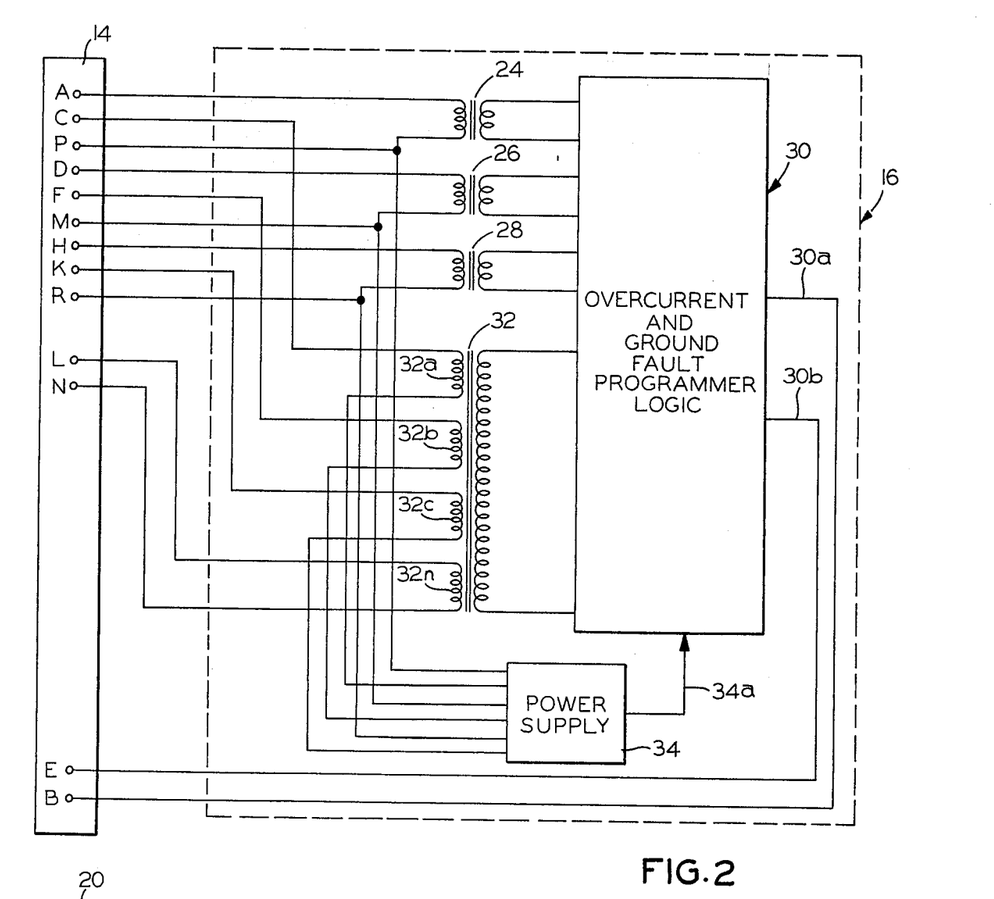

While the test set of the present invention may be adapted to verify the operability of static trip units of various designs, for purposes of illustration trip unit 16 is generally disclosed as having the construction detailed in commonly assigned U.S. Pat. No. 3,786,311. Thus, as seen in FIG. 2, static trip unit 16 includes three auxiliary transformers, 24, 26 and 28 each having a secondary winding separately connected to supply phase current monitoring signals to a phase overcurrent signal processing section of overcurrent and ground fault programmer logic, generally indicated at 30. Also included in static trip unit 16 is a differential current transformer 32 having plural primary windings 32a, 32b, 32c, and 32n, and a secondary winding connected to supply a current signal indicative of an imbalance in the vectorial sum of the primary currents to a ground fault signal processing section of programmer logic 30.

A lower supply 34, included in static trip unit 16, is connected to derive from the phase current monitoring signals operating power for the programmer logic 30, as supplied over connection 34a. Thus, as seen in FIG. 2, phase monitoring current at terminal A of the static trip unit cable connector 14 is routed via cable harness 15 through the primary of auxiliary transformer 24, down to the power supply 34, back through primary winding 32a of differential transformer 32 to terminal C. Similarly, phase monitoring current at terminal D of connector 14 is routed through the primary of auxiliary transformer 26, down to the power supply, and back through primary winding 32b of transformer 32 to terminal F. Finally, connector terminal H routes current through the primary winding of auxiliary transformer 28, thence to power supply 34, and back through primary winding 32c of transformer 32 to connector terminal K. For those applications wherein the circuit being protected by the static trip circuit breaker is a three-phase, four-wire circuit, the inclusion of secondary winding 32n in differential transformer 32 is necessary in order to detect ground leakage current, and the two sides of this primary winding are brought out via cable harness 15 to terminals L and N of connector 14.

In the event the programmer logic 30 is to initiate a trip function, an energizing voltage for activating the trip coil of a trip solenoid is impressed across output leads 30a and 30b of the programmer logic, which are brought out via cable harness 15 to terminals E and B of connector 14. Strictly for purposes of test set 10, the lower side of the primary winding of auxiliary transformer 24 is brought out via cable harness 15 to terminal P of connector 14, while the lower side of the primary winding for auxiliary transformer 26 is brought out to connector terminal M and the lower side of the primary winding for auxiliary transformer 28 is brought out to connector terminal R.

Figure 3:
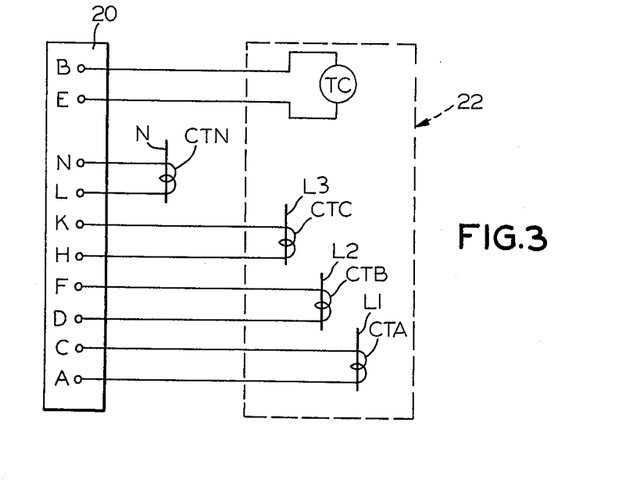
FIG. 3 is a simplified circuit diagram of the circuit breaker of FIG. 1.

Turning to FIG. 3, connector 20 includes terminals B and E which are connected by leads included in the circuit breaker cable harness 21 to opposite sides of the trip coil TC of a trip solenoid included within circuit breaker 22. Also mounted within circuit breaker 22 are three current transformers CTA, CTB and CTC, respectively inductively coupled with phase load current carrying segments L1, L2 and L3 in the separate poles of the three-phase breaker. The two sides of the secondary winding for current transformer CTA are brought out via cable harness 21 to terminals A and C of connector 20, while the two sides of the secondary winding for current transformer CTB are brought out to connector terminal D and F, and the two sides of the secondary winding for current transformer CTC are brought out to connector terminals H and K. A fourth transformer, CTN, typically mounted externally of circuit breaker 22 in inductively coupled relation with the neutral conductor N of the protected circuit, includes a secondary winding having its two sides brought out to terminals L and N of connector 20.

As previously noted, when circuit breaker 22 is put into service, connector 14 of the trip unit cable harness is electrically mated with connector 20 of the circuit breaker cable harness. Thus mated, the corresponding lettered terminals of the two connectors achieve electrical interconnection. Specifically, load current flowing in pole segment L1 of circuit breaker 22 induces a phase current monitoring signal in the secondary of current transformer CTA which is routed via connectors 20 and 14 and associated cables for circulation through the primary of auxiliary transformer 24, power supply 34 and primary winding 32a of differential current transformer 32 in trip unit 16 of FIG. 2. Similiary, a phase current monitoring signal induced in the secondary winding of current transformer CTB is circulated through the primary of auxiliary transformer 26, power supply 34 and primary 32b of transformer 32, while a phase current monitoring signal induced in the secondary of current transformer CTC is circulated through the primary of auxiliary transformer 28, power supply 34 and primary 32c of transformer 32. Any current flowing in the neutral conductor of the protected power circuit induces a current monitoring signal in the secondary of current transformer CTN, which circulates through the primary winding 32n of transformer 32. Finally, the interconnected B and E terminals of the mated connectors 14 and 20 serve to apply the energization voltage developed across output leads 30a and 30b of programmer logic 30 (FIG. 2) directly across the trip coil TC of the trip solenoid included with circuit breaker 22.

Figure 4:
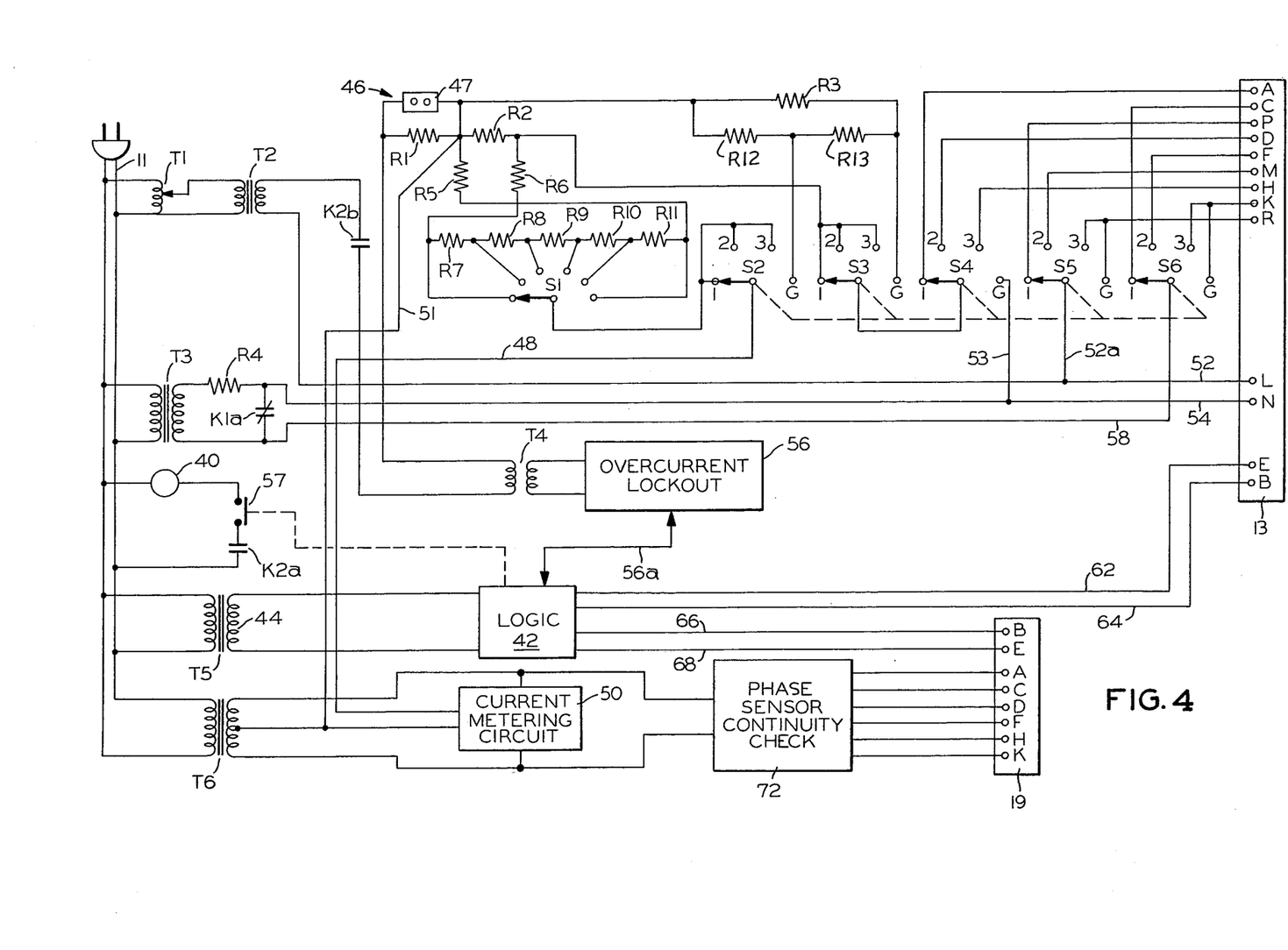
FIG. 4 is a circuit diagram, partially in block form, of the field test set of FIG. 1.
Figure 5:
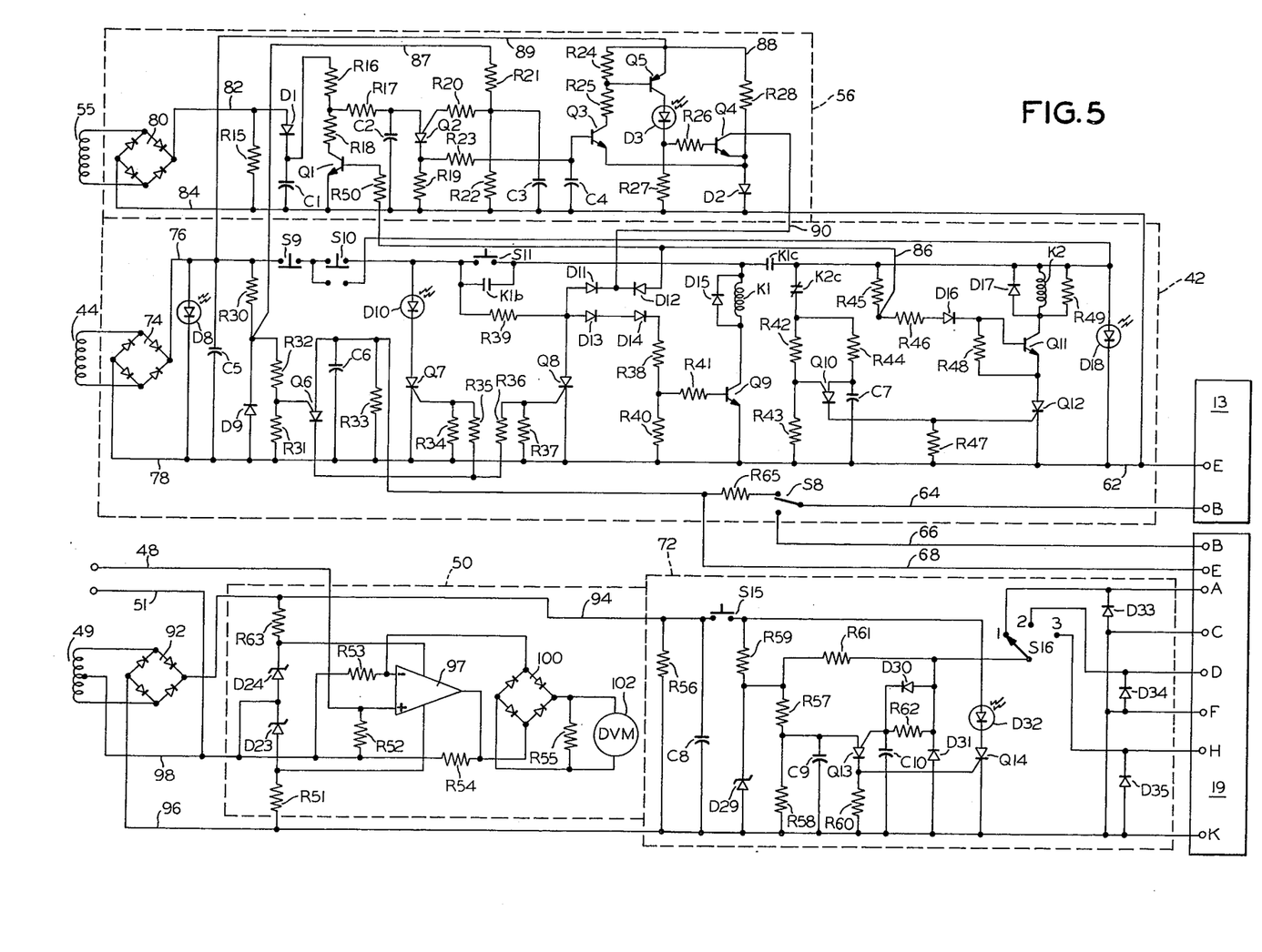
FIG. 5 is a detailed circuit schematic diagram of those portions of the circuit diagram of FIG. 4 illustrated in block diagram form.

Referring now to FIG. 4, the test set power cord 11 supplies 120 VAC power in parallel to a variable transformer T1, an isolation transformer T3, a voltage step-down transformer T5 and a voltage step-down transformer T6. Also powered directly off of cord 11 is an elapsed time meter 40 connected in a series energization circuit including a manually operated switch S7 and normally open contacts K2a of a relay which, as will be seen from the description of FIG. 5, is included in test set logic circuitry 42 powered off the secondary winding 44 of transformer T5.

The selectively variable output of transformer T1 drives the primary of a voltage step-down transformer T2. As will be seen from the description to follow, transformer T1 is variably adjusted to establish a desired level of test signal current, which is routed to a selected one of the auxiliary transformer primary windings, in the case of a phase overcurrent test, or to primary winding 32n of the differential transformer 32, in the case of a ground fault test (FIG. 2).

More specifically, the secondary of transformer T2 has its upper side connected to supply test signal current through relay contacts K2b, when closed, and the primary of a transformer T4 to a current meter calibrating network, generally indicated at 46 in FIG. 4. This calibrating network includes series connected resistors R1 and R2 through which phase overcurrent test signal current is routed commonly to fixed contacts 1, 2 and 3 of a selector switch S3. Resistor R1 is preferably a low-valued, precision resistor across which are provided external monitor jacks 47 to which connection may be made for external metering equipment capable of achieving more precise measurements of test signal current levels and trip times than can be provided by the metering equipment included in the test set. Connected across resistor R2 is a voltage divider network consisting of resistors R5 through R11. The junctions between the resistors of this voltage divider network are brought out to separate stationary contacts of a selector switch S1, whose movable contact is connected in common to stationary contacts 1, 2 and 3 of selector switch S2. The movable contact of this selector switch is connected via lead 48 to one input terminal of a digital readout, test current level meter circuit 50. The junction between resistors R1 and R2 is connected via lead 51 to the other input terminal of meter circuit 50.

The movable contact of switch S1 is positioned to engage the appropriate stationary contact which is correlated with the continuous current rating adjustably established in the static trip unit 16. The individual resistances of the voltage divider network are selected such that, when a test signal current level corresponding to the continuous current rating established by the corresponding settings of the trip unit and selector switch S1 flows through resistor R2, the meter 50 gives a digital readout of one. When the trip unit is to be tested at ten times rated current, transformer T1 is simply adjusted until digital meter 50 reads ten. In other words, by virtue of the calibrating circuit 46, the digital meter 50 is adapted to measure the test signal current level in multiples of the established rated current for the trip unit. Calibrating meter 50 to read in multiples of rated current rather than directly in amperes makes it more convenient for the test set operator to properly adjust the test signal current level for each particular test to be conducted. This is particularly so since it is customary in the trade to run tests on the basis of multiples of rated current. Thus, the test set operator is freed of the necessity of having to multiply the established rated current times the multiple at which a particular test is to be run in order to arrive at an ampere value which must be read from the meter via manual adjustment of transformer T1.

Still referring to FIG. 4, the adjustably established test signal current appearing at each of the fixed contacts 1, 2 and 3 of test selector switch S3 is routed by its movable contact of test selector switch S4. It is seen that fixed contact 1 of this selector switch is connected to terminal A of test set connector 13, while its fixed terminal 2 is connected to connector terminal D and its fixed contact 3 is connected to connector terminal H.

Referring to FIG. 2, it is seen that when the test set connector 13 and the trip unit connector 14 are mated, the test signal current, depending upon the position of selector switch S4, is routed to the upper side of one of the primary windings of auxiliary transformers 24, 26 and 28.

Returning for the moment to FIG. 4, it is seen that the lower side of the secondary winding of transformer T2, from which the test signal current is derived, is connected to the movable contact of selector switch S5 over lead 52. As indicated diagrammatically, the movable contacts of selector switches S2 through S5, plus the as yet unmentioned selector switch S6, are ganged together such that they are correspondingly positioned in concert to their respective fixed contacts 1, 2 and 3. It is seen that fixed contact 1 of selector switch S5 is connected to terminal P of test set connector 13, while fixed contact 2 is connected to connector terminal M and fixed contact 3 is connected to connector terminal R. From FIG. 2, it is seen that when the test set connector 13 is mated with the trip unit connector 14, the lower sides of the primary windings of auxiliary transformers 24, 25 and 28 are respectively connected to fixed contacts 1, 2 and 3 of selector switch S5.

From the description thus far, it is seen that the test signal current developed at the secondary of transformer T2 is circulated through the primary of transformer T4, meter calibrating circuit 46, selector switch S3, selector switch S4, a selected one of the primary windings of auxiliary transformers 24, 25 and 28, and back to the secondary winding of T2 via selector switch S5 and lead 52. By virtue of this circulation of the test signal current through one of the auxiliary transformer primaries, a simulated phase current signal is induced in the associated auxiliary transformer secondary for injection into the programmer logic 30 (FIG. 2).

The fourth fixed contact of each of the test selector switches S2 through S6 is labeled G to which the movable contacts are positioned in concert pursuant to verifying the response of the static trip unit 16 to a simulated ground fault condition. For a ground fault test, the test signal current developed in the secondary of transformer T2 is routed through the primary of transformer T4 and resistors R1 and R3 of the meter calibrating circuit 46 to fixed contact G of test selector switch S3. It is seen that with selector switches S2 and S3 positioned to their fixed contacts G, resistors R2 and R5 through R11, plus selector switch S1 are electrically removed from calibrating circuit 46. Resistor R3 is paralleled by a voltage divider consisting of resistors R12 and R13, with the junction therebetween connected to fixed contact G of selector switch S2. The reistance values of resistors R12 and R13 are selected such that with meter circuit 50 connected across resistor R12, it is calibrated to read the test signal current level as a multiple of an arbitrarily selected ground fault current level, e.g., the nominal breaker current rating. This test signal current appearing at fixed contact G of test selector switch S3 is routed via its movable contact to the movable contact of selector switch S4. With this selector switch also positioned to fixed contact G, the test signal current is routed via lead 53 and lead 54 to terminal N of test set connector 13. It is seen from FIG. 2, that with the test set and trip unit connectors mated, this test signal current is routed through the mated connector terminals N to the lower side of primary winding 32n of differential transformer 32 in trip unit 16. The test signal current flows through this primary winding and out to connector terminals L, returning to the bottom side of the secondary winding of transformer T2 over lead 52. It is thus seen that the circulation of this test signal current through differential transformer primary winding 32n creates a primary current imbalance effective to induce a simulated ground fault signal current in the secondary of this transformer for injection into the ground fault section of programmer logic 30 (FIG. 2).

The test signal current circulating through the primary winding of transformer T4 is monitored by an overcurrent lockout circuit 56 connected to the secondary winding 55 of this transformer. This lockout circuit, detailed in FIG. 5, functions to shut down the test set by imposing a clamping restraint over connection 56a on the test set logic circuitry 42 should high levels of test signal current be injected into static trip unit 16 for an inordinately long period. The trip unit is thus protected from the potentially damaging consequences of high current stress.

During each test run, the trip unit power supply 34 (FIG. 2) is shunt fed from the secondary of isolating transformer T3. Thus, as seen in FIG. 4, the upper side of the secondary winding of transformer T3 is connected through a resistor R4 and over lead 54 to terminal N of the test set connector 13. The bottom side of this secondary winding is connected over lead 58 to the movable contact of test selector switch S6. The right end of resistor R4 is connected back to the lower side of the secondary winding of transformer T3 through normally closed relay contacts K1a, which open under the control of test set logic circuitry 42 at the beginning of each test run. Referring jointly to FIGS. 2 and 4, it is seen that with the test set and trip unit connectors mated, current in the secondary of isolation transformer T3 flows through lead 54, the interconnected terminals N, winding 32n of differential transformer 32 in trip unit 16, and back to the interconnected terminals L of the test set and trip unit connectors. From connector terminals L, the power supply current flows via leads 52 and 51 to the movable contact of test selector switch S5. Depending upon the position of this switch, the power supply current is fed to either of the connector terminals P, M or R. Assuming that the movable contact of switch 55 is positioned to fixed contact 1, as shown, the power supply current is fed to connector terminal P of test set connector 13. It is seen in FIG. 2 that terminal P of the trip unit connector 14 is connected to the lower side of the primary winding of auxiliary transformer 24. From this point, the power supply current flows down to the trip unit power supply 34, returning through primary winding 32a of transformer 32 to terminal C of test set connector 14. From terminal C of test set connector 13, the power supply current returns to the bottom side of the primary winding of isolation transformer T3 through fixed contact 1 and the movable contact of selector switch S6 and lead 58.

It is thus seen that this power supply current at the secondary of isolating transformer T3 is circulated through differential transformer primary winding 32n, trip unit power supply 34, and, depending upon the positions of test selector switches S5 and S6, one of the three other differential transformer primary windings 32a, 32b or 32c. The reason that this power supply current is circulated through two primary windings of differential transformer 32 is to maintain the primary currents balanced and thus avoid inducing a spurious ground fault signal in its secondary winding having the effect of initiating an unwanted ground fault trip function. It is also important to note that this power supply current does not circulate through any of the primary windings of auxiliary transformer 24, 26 and 28, and thus the injection of spurious overcurrent signals into the programmer logic 30 is also avoided. Of particular significance is the fact that by shunt feeding the trip unit power supply 34 from isolation transformer T3, powering of the trip unit power supply 34 from the test signal current applied to the primaries of auxiliary transformers 24, 26 and 28 is avoided. Thus, these test signal currents can be applied to the trip unit 16 at much lower voltages than would otherwise be possible. As a consequence, efficiencies in test set circuit design are achieved.

It should be understood that shunt feeding of the trip unit power supply in the above-described manner is primarily for the sake of convenience prompted by the accessibility to the test set of the various trip unit connection points. Thus the trip unit power supply 34 could be shunt fed directly from the test set exclusive of the differential transformer primary windings without departing from the present invention.

The test set logic circuitry 42, as seen in FIG. 4, is powered from secondary winding 44 of transformer T5. As will be seen clearly from the detailed description of the test set logic circuit schematic seen in FIG. 5, in addition to controlling the operation of the test set, the test set logic circuitry also functions to monitor the sufficiency of the trip coil activating energy developed across output leads 30a and 30b of the trip unit programmer logic 30, which are brought out to terminals E and B of trip unit connector 14 (FIG. 2). It is seen from FIG. 4 that with the test set and trip unit connectors mated, this trip coil activating current is applied to the test set logic circuitry 42 via terminals E and B of test set connector 13 and leads 62 and 64. Rather than solely monitor the trip coil activating current developed by trip unit 16, the test set logic circuitry 42 may be conditioned to route this current supplied over leads 62 and 64 directly to leads 66 and 68 running to terminals B and E of test set connector 19. It is seen from FIG. 3 that with the test set connector 19 and circuit breaker connector 20 mated, the trip coil activating current generated by the trip unit 16 is applied directly to the trip coil to determine if actual tripping of the circuit breaker can be effected, in addition to monitoring activating current sufficiency back at the test set.

Still referring to FIG. 4, the secondary winding 70 of transformer T6 is connected to powr the test signal current level meter circuit 50, as well as a phase sensor continuity check circuit 72. As will be seen from FIG. 5, the phase sensor continuity check circuit serves to check the continuity of the secondary windings of phase sensor current transformers CTA, CTB and CTC included within circuit breaker 22, as seen in FIG. 3. To this end, the test set cable 18 includes individual leads brought out from the phase sensor continuity check circuit 72 to the individual terminals A, C, D, F, H and K of connector 19. From FIG. 3, it is seen that with the test set connector 19 mated with the circuit breaker connector 20, the phase sensor current transformer secondary windings are separately connected to the phase sensor continuity check circuit 72 of test set 10.

Turning now to FIG. 5, secondary winding 44 of transformer T5 powering the test set logic circuitry 42 is connected across a diode bridge 74 operating to apply a full-wave rectified voltage across buses 76 and 78.

Diode D8, connected across bridge 74, lights up when the power to test set 10 is on. The voltage across buses 76 and 78 is filtered by a capacitor C5. Also connected across these buses is a series combination of a resistor R30 and a Zener diode D9. The Zener diode serves to clamp the voltage at its junction with resistor R30 to a regulated level corresponding to its Zener voltage. This regulated voltage is impressed across a voltage divider consisting of resistors R31 and R32, with the junction therebetween connected to the gate of a programmable uni-junction transistor Q6. The anode of this transistor is connected to negative bus 78 through the parallel combination of a capacitor C6 and a resistor R33, to terminal E of test set connector 19 via lead 68, and to terminal B of test set connector 13 via resistor R65, a selector switch S8 and lead 64.

Beyond resistor R30, positive voltage bus 76 is selectively interrupted by a normally closed reset switch S9 and a normally closed preset current switch S10. Opening of reset switch S9 aborts any test run in progress. At a point beyond switch S10, bus 76 is connected to bus 78 via the series combination of a light emitting diode D10 and a silicon controlled rectifier Q7. The gate of this controlled rectifier is connected to bus 78 by resistor R34 and to the cathode of uni-junction transistor Q6 through a resistor R35. Bus 76 is connected through a resistor R39 to the anode of a second controlled rectifier Q8, whose cathode is connected directly to bus 78. The gate of this controlled rectifier is connected through a resistor R36 to the cathode of uni-junction transistor Q6 and also to bus 78 through a resistor R37. The anode of controlled rectifier Q8 is connected to a pair of like-poled diodes D12 and D14, and a pair of resistors R38 and R40 to bus 78.

Beyond its junction with resistor R39, positive voltage bus 76 is interrupted by a normally open start switch S11, whose contacts are shunted by normally open relay contacts K1b. Beyond start switch S11, bus 76 is connected through the operating coil of a relay K1 to the collector of a transistor Q9. The emitter of this transistor is connected directly to bus 78, while its base is connected to the junction between resistors R38 and R40 through a resistor R41. The operating coil of relay K1 is shunted by a free-wheeling diode D15. Beyond its junction with relay coil K1, bus 76 is interrupted by normally open contacts K1c of relay K1. Bus 76 is then connected to bus 78 through the series combination of normally closed relay contacts K2c, resistor R42 and resistor R43. The junction between these two resistors is connected to the gate input of a programmable uni-junction transistor Q10, whose anode is returned to the junction between resistor R42 and relay contacts K2c through resistor R44. In addition, the anode of uni-junction transistor Q10 is connected to bus 78 through a timing capacitor C7. The cathode of uni-junction transistor Q10 is connected directly to the gate of a silicon controlled rectifier Q12; this gate being referenced to the negative voltage bus 78 through resistor R47.

Bus 76 is also connected through the series combination of a resistor R45, resistor R46, and a diode D16 to the base of a transistor Q11. The emitter of this transistor is connected directly to the anode of controlled rectifier Q12 and back to its base through a resistor R48 to provide a base-emitter leakage current path. The collector of transistor Q11 is connected to positive voltage bus 76 through the parallel combination of a resistor R49, the operating coil for a relay K2 and a freewheeling diode D17. Finally, a light emitting diode D18 is connected across buses 76 and 78.

A preliminary step to each test run performed by test set 10 is to preset the level of the test signal current which is to be applied to the one trip unit auxiliary transformer primary winding or the trip unit neutral winding 32n of differential current transformer 32, as selected by the ganged test selector switches in the case of a ground fault response test. To this end, preset current switch S10 is depressed to bridge its lower set of contacts and thus apply operating voltage to the section of bus 76 to the right of normally open relay contacts K1c. Diode D18 lights up to indicate testing activity. Current is drawn through the normally closed relay contacts K2c and resistor R44 to charge capacitor C7. When the voltge developed across capacitor C7 raises the anode voltage of uni-junction transistor Q10 to a level in excess of its gate voltage developed at the junction of resistors R42 and R43, this transistor fires to trigger control rectifier Q12 into conduction. Transistor Q11 also goes into conduction by virtue of the base drive current made available through resistors R45, R46 and diode D16. Energizing current is drawn through the operating coil of relay K2 and its contacts move to their activated positions. Resistor R49 provides immediate current to sustain the conduction of controlled rectifier Q11 until the current through the operating coil for relay K2 builds up to the requisite activating level.

The normally closed relay contacts K2c open upon activation of relay K2, disabling the timing circuit including timing capacitor C7 and uni-junction transistor Q10. More significantly however, relay contacts K2b close (FIG. 4), such that test signal current from the secondary of transformer T2 flows through the calibration circuit 46 and the one of the trip unit transformer primary windings selected by the ganged test selector switches. Variable transformer T1 is then manually adjusted while observing the test current level meter readout pursuant to establishing the desired test signal current level. It should be noted at this point that relay K1 is not activated, since it is seen that the section of bus 76 to which its operating coil is connected remains dead during the presetting of the test signal level. Moreover, its contacts K1a remain closed to prevent the shunt feeding of power from the secondary of isolation transformer T3 to the trip unit power supply 34 (FIGS. 2 and 4). Consequently, the trip unit 16 is not powered up at this time, and it cannot respond to the test signal current as its level is being adjusted preparatory to a test run. Preferably, the preset current switch S10 is mechanically linked to switch S7 included in the elapsed time metering circuit, such that the elapsed timer 40 is not energized upon closure of relay contacts K2a incident to energization of the operating coil for relay K2. Once the test signal current level has been adjusted to the desired level, the preset current switch S10 is released, whereupon it closes on its upper contacts, thereby removing operating voltage from the section of bus 76 beyond the open relay contacts Kc.

Having preset the test signal current level, it now remains to momentarily close start switch S11 to initiate a test run. It is seen from FIG. 5 that this action applies supply voltage to the top side of the operating coil for relay K1. Base drive current for transistor Q9 is available through resistor R39, diodes D13 and D14, resistor R38 and resistor R41, and this transistor turns on to draw activating current through relay operating coil K1. Relay contacts K1b close to shunt the start switch contacts, permitting its release. Relay contact K1a in the secondary circuit of isolation transformer T3 open, thus enabling the shunt feeding of current to the trip unit power supply 34, pursuant to bringing it up to voltage. In addition, relay contacts K1c, included in bus 76, close, supplying operating voltage to the timing circuit consisting of capacitor C7 and uni-junction transistor Q10, as well as to the upper side of relay operating coil K2. Diode D18 lights up to again signal test activity. After a predetermined delay, the anode voltage of uni-junction transistor Q10 rises to a level exceeding its gate voltage, whereupon this transistor fires to trigger control rectifier Q12. Activating current is then drawn through relay operating coil K2. The contacts K2b for this relay then close to enable the circulation of test signal current through the primary of transformer T4, calibration circuit 46, and the primary winding of the trip unit primary transformer selected by the positions of the test switches. Simultaneously, contacts K2a close, completing the energization circuit for the elapsed time meter 40.

At this point it should be noted that, during a test run, relay K2 is activated subsequently to relay K1 following a predetermined time delay imposed by the timing circuit including capacitor C7 and uni-junction transistor Q10. This is done to ensure that the trip unit power supply 34 is fully powered up from the secondary of isolation transformer T3 prior to the application of test signal current to the trip unit. As a consequence, assurance is provided that the trip unit is capable of immediately responding to the test signal.

ASsuming the trip unit 16 is functioning proper, it will initiate a trip function, either after an appropriate delay or without intentional delay depending upon the level of the test signal current, by imposing a trip coil activating voltage across its output leads 30a, 30b. This activating voltage is communicated to terminals E and B of trip unit connector 14, and thence to terminals E and B of test set connector 13. It is seen from FIG. 5 that test set connector terminal E is connected directly to bus 78 of the test set logic circuit 42. Assuming that selector switch S8 is positioned to its upper terminal, meaning that the trip coil activating current generated by trip unit 16 is to be examined solely by the test set, the current flows from test set connector terminal B through lead 64, selector switch S8, resistor R65, resistor R33 and capacitor C6 in parallel, and bus 78 back to test set connector terminal E. If the peak amplitude of this trip coil activating current is satisfactorily high, the anode voltage for transistor Q6, as developed across resistor R33 and capacitor C6, exceeds its gate voltage, and this transistor fires to effect concurrent triggering of control rectifiers Q7 and Q8. Capacitor C6 discharges to provide sufficient energy to ensure triggering of both controlled rectifiers, while resistors R35 and R36 serve to promote an equal sharing of this triggering energy. With the conduction of controlled rectifier Q7, light emitting diode D10 is energized to signal to the test operator that a satisfactory trip has been achieved. With the conduction of control rectifier Q8, transistor Q9 is deprived of base drive current, whereupon it goes into nonconduction to effect de-energization of relay operating coil K1. Contacts K1b of this relay open to break the holding circuit shunting start switch S11, while its contacts K1c also open to drop out relay K2. Relay contacts K1a of relay K1 reclose to terminate the shunt feeding of the trip unit power supply 34, while contacts K2b open to terminate the flow of test signal current and contacts K2a open to deactivate the elapsed time meter 40 which then records the trip delay time, respectively.

If it is desired to actually trip the circuit breaker in concluding a test run, selector switch S8 is positioned to its lower contact, whereupon terminal B of test set connector 13 is connected directly to terminal E of test set connector 19. The current flow occasioned by the trip coil activating voltage developed across leads 30a and 30b of the trip unit programmer logic 30 is thus routed by selector switch S8 through the trip coil TC within circuit breaker 22 and back out to terminal E of test set connector 19, which is connected via lead 68 to the anode of uni-junction transistor Q6. Assuming that the trip coil activating current generated by the trip unit programmer logic is sufficient, trip coil TC of the trip solenoid will be energized sufficiently to activate the trip coil and effect actual tripping of the circuit breaker, while sufficient voltage will be developed to fire uni-junction transistor Q6, terminating the test run in the manner previously described. The value of resistor R65 is selected to approximate the resistance of the trip solenoid trip coil TC such that the voltage developed at the anode of uni-junction transistor Q6 is essentially the same regardless of the routing of the trip coil energizing current by selector switch S8.

Turning now to a description of the overcurrent lockout circuit 56 detailed in FIG. 5, it is seen that the secondary winding 55 of transformer T4 is connected across a diode fullwave rectifying network 80 having its positive output terminal connected to a bus 82 and its negative output terminal connected to a bus 84, which is referenced to the negative bus 78 of the test set control logic 42 via a lead 85. A resistor R15 is connected between buses 82 and 84 in the overcurrent lockout circuit, and this resistor is shunted by the series combination of a blocking diode D1 and a filtering capacitor C1. The junction between this diode and capacitor is connected through resistors R16 and R18 to the collector of a transistor Q1. The emitter of this transistor is connected directly to bus 84, while its base is connected via a resistor R50 and lead 86 to the test set logic circuit 42 at the junction between resistors R45 and R46 and also to the anode of a diode D12. The junction between resistors R16 and R18 is connected to bus 84 through a resistor R17 and a storage capacitor C2. The junction between this resistor and capacitor is connected to the anode of a uni-junction transistor Q2, whose cathode is connected to bus 84 through a resistor R19. The reference voltage developed at the junction of resistor R30 and Zener diode D9 in the test set logic circuit 42 is applied over lead 87 to the upper end of a voltage divider, consisting of resistors R21 and R22; the lower end of this voltage divider being connected to bus 84.

The junction between resistors R21 and R22 is connected to the gate of uni-junction transistor Q2 through a resistor R20. This junction between resistors R21 and R22 is also coupled to bus 84 through a filtering capacitor C3. The cathode of uni-junction transistor Q2 is also connected via a resistor R23 to the base of a transistor Q3, which is also coupled to bus 84 via a noise suppressing capacitor C4. The collector of this transistor is connected through resistors R24 and R25 to a bus 88 which is connected in common with bus 76 of the test set control logic circuit via a lead 89. The junction of resistors R24 and R25 is applied to the base of transistor Q5 emitter is connected directly to bus 88 and whose collector is connected through a light emitting diode D3 and a resistor R27 to bus 84. The junction between diode D3 and resistor R27 is applied to the base of a transistor Q4 through a resistor R26. The emitter of this transistor, together with the emitter of transistor Q3, is connected to the junction between a resistor R28 and a diode D2 connected in series between bus 88 and bus 84. The collector of transistor Q4 is connected via lead 90 to the junction between the cathodes of diodes D11 and D12; the anode of diode D11 being connected to the anode of controlled rectifier Q8 in the test set logic circuit 42.

As generally described above, overcurrent lockout circuit 56 is devoted to protecting the trip unit from prolonged subjection to a high level test signal current. To this end, the test signal current circulating through the primary of transformer T4, induces a test signal monitoring current in secondary winding 55 which is full-wave rectified by bridge 80 and filtered by capacitor C1. During a test run, transistor Q1 receives base drive current over lead 86 from the junction between resistors R45 and R46 of the test set control logic circuit 42, and this transistor assumes a conductive state. Capacitor C2 charges to a voltage essentially proportional to the average RMS value of the test signal monitoring current. If the voltage developing across this capacitor rises to a value in excess of the reference voltage at the junction of resistors R21 and R22, uni-junction transistor Q2 fires. Capacitor C2 begins discharging through this uni-junction transistor to provide base drive current for transistor Q3, which goes into conduction to complete a base drive circuit for transistor Q5. This latter transistor turns on to conduct current for activating light emitting diode D3 and also for driving transistor Q4 into conduction. The lighting of diode D3 signals to the operator that a lockout function is taking effect. With transistor Q4 conductive, base drive current for transistor Q9 in the test set logic circuit 42 is diverted through diode D11, the collector-emitter circuit of transistor Q4 and diode D2. Transistor Q9 turns off to drop out relay K1. Similarly, base drive current for transistor Q11 in the test set logic circuit is diverted through diode D12, the collector-emitter circuit of transistor Q4 and diode D2. Transistor Q11 thus turns off to drop out relay K2. With the dropping out of both relays K1 and K2, the test run is automatically aborted to halt the application of test signal current to trip unit 16.

As an important feature of overcurrent lockout circuit 56, transistor Q1 goes into nonconduction with the termination of the test run, and thus the only discharge path for capacitor C2 is through uni-junction transistor Q2. Resistors R19 and R23, and particularly the former, are selected to have high resistance values, such that the rate at which capacitor C2 discharges following the termination of a test run by the lockout circuit is quite slow. As a consequence, the discharging of capacitor C2 constitutes a continuing source of base drive current for transistor Q3, and thus this transistor remains on to sustain the conduction of transistors Q4 and Q5. It is seen that as long as transistor Q4 remains conductive, base drive current continues to be diverted from transistors Q9 and Q11, and thus energization of the operating coils for relays K1 and K2 pursuant to initiating a subsequent test run is precluded. In an operative embodiment of the present invention, the discharge rate for capacitor C2 was established so as to sustain the lockout restraint and thus render the test set inoperative for approximately 70 seconds. Diode D2 in the lockout circuit ensures that transistors Q3 and Q4 are back biased until transistor Q2 is fired. The inclusion of the diode pair D13 and D14 in test set logic 42 is made so that the voltage at the anode of diode D13 can be clamped to a sufficiently low value by lockout circuit 56 to assure the diversion of base current from transistor Q9.

Still referring to FIG. 5, secondary winding 49 of transformer T6, seen in FIG. 4, is connected across a full-wave diode rectifying bridge 92. The positive output terminal of this bridge is connected to bus 94, while its negative output terminal is connected to bus 96. Connected in series across buses 94 and 96 are a resistor R63, a Zener diode D24, a second Zener diode D23, and a second resistor R51. The junctions of resistor R63 with Zener diode 24 and Zener diode 23 with resistor R51 are tapped to provide regulated supply voltages for an operational amplifier 97. A center tap on transformer secondary winding 49 of transformer T6 is brought out on bus 98, which is referenced to the junction between Zener diodes D23 and D24. Bus 98 is connected to the non-inverting input of an operational amplifier 97 through a resistor 52 and to the inverting input thereof through a resistor R53. The inverting input of operational amplifier 97 is also connected to one input terminal of full-wave diode rectifying bridge 100, while the output of this operational amplifier is connected to the other bridge input terminal to which bus 98 is also connected through resistor R54. Referring jointly to FIGS. 4 and 5, lead 48 from the calibration circuit 46 is connected directly to the non-inverting input terminal of opertional amplifier 97, while lead 51 from the calibration circuit is connected to bus 98 at the junction between resistors R53 and R54. Connected across the output of bridge rectifying network 100 is a digital volt meter 102, which is shunted by a resistor R55.

The function of operational amplifier 97 is to drive the digital volt meter via the bridge network 100 in manner dictated by the calibrating circuit 46 so as to compensate for the variable diode voltage drops in the bridge network. Specifically, the operational amplifier drives the digital volt meter with sufficient DC current such that the voltage developed across resistor R53, as applied to its inverting input, matches the voltage developed across resistor R52 by the meter calibrating circuit 46 and applied to its non-inverting input. Consequently the digital volt meter reads a DC voltage precisely related to the AC meter calibrating voltage derived from calibrating circuit 46 unaffected by the diode drops in the bridge network 100.

Still referring to FIG. 5, buses 94 and 96 from the fullwave rectifying network 92 connected in the secondary transformer T6 are also utilized to power and phase sensor continuity check circuit 72. To this end, a bleed resistor R56 and a filtering capacitor C8 are connected in parallel between buses 94 and 96. Bus 94 is interrupted by a normally open push-to-test switch S15. Beyond this switch, a series combination of a resistor R59 and a Zener diode D29 is connected between the buses 94 and 96. The junction between this resistor and Zener diode is connected to bus 96 through a potential divider, consisting of resistors R57 and R58, and also to the movable contact of a selector switch S16 through a resistor R61. The junction between resistors R57 and R58 is connected to the anode of a uni-junction transistor Q13 and also to bus 96 through a capacitor C9. The junction between resistor R61 and the movable contact of selector switch S16 is connected to the gate of transistor Q13 through the parallel combination of a diode D30 and a resistor R62 and also is connected to bus 96 through a diode D31. The cathode of transistor Q13 is connected to bus 96 through a resistor R60, while its gate is coupled to bus 96 through a filtering capacitor C10.

Beyond switch S15, a series combination of a light emitting diode D32 and a controlled rectifier Q14 is connected between bus 94 and bus 96. The gate of control rectifier Q14 is directly connected to the cathode of uni-junction transistor Q13. Fixed contacts 1, 2 and 3 of selector switch S16 are respectively connected via individual conductors of test set cable 18 to terminals A, D and H of test set connector 19. Terminal connectors C, F and K are connected in common to bus 96. A free-wheeling diode D33 is connected between terminal connectors A and C, while free-wheeling diodes D34 and D35 are respectively connected between connector terminals D and F and between connector terminals H and K.

From FIG. 3, it is seen that when test set connector 19 is mated with circuit breaker connector 20, the corresponding lettered connector terminals are brought into electrical connection. Thus, test set connector terminals A and C become electrically connected across current transformer CTA, while test set connector terminals D and F become connected across current transformer CTB and test set connector terminals H and K become connected across current transformer CTC. To test the continuity of current transformer CTA, for example, selector switch S16 is positioned as shown with its movable contact engaging fixed contact 1, and switch S15 is held closed. The regulated voltage developed across Zener diode D26 is applied across the series circuit including resistor R61 and the secondary winding of current transformer CTA. If the continuity of the current transformer secondary winding CTA is acceptably high, i.e., exhibits a low resistance, most of the voltage drop will appear across resistor R61, and thus the voltage appearing at the movable contact of selector switch S16 will be quite low. The voltage applied to the anode of uni-junction transistor Q13 from the junction of resistors R57 and R58 is programmed such that, when the resistance of a current transformer secondary winding is, for example, less than 100 ohms, this voltage will exceed the voltage appearing at the movable contact of selector switch S16 as coupled to the gate of this transistor through diode D30. In this situation, uni-junction transistor Q13 fires, and capacitor C9 discharges therethrough to generate a gate voltage across resistor R60 for triggering control rectifier Q14 into conduction. Current is drawn from bus 94 through light emitting diode D32, and the light emitted by this diode indicates to the test set operator that the current transformer has passed the continuity check test.

On the other hand, if the resistance of the current transformer secondary winding is greater than 100 ohms in the given example, the voltage drop developed thereacross is increased, as is the voltage developed at the movable contact of selector switch S16. The gate voltage applied to uni-junction Q13 is thus in excess of the voltage applied to its anode, and consequently it does not fire to trigger controlled rectifier Q14. Light emitting diode D32 is not energized, thereby signalling to the operator that the particular current transformer secondary winding has failed its continuity check.

To check the continuity of current transformer CTB, selector switch S16 is merely positioned to its fixed contact 2, while the continuity of current transformer CTC is checked by positioning the movable contact of this selector switch to its fixed contact 3. Diode D31 is a free-wheeling diode for the current transformer secondary winding being tested for continuity. It will be noted that this continuity check also verifies the integrity of the circuit breaker wiring harness 21.

From the foregoing description, it is seen that the present invention provides a field test set capable of testing the operability of static trip circuit breakers with great precision. This is achieved, in part, by being able to preset the test signal current level while the test signal current is actually flowing through the auxiliary transformer primary winding which is to be involved in an overcurrent trip test. Thus the test signal current injected into the static trip unit during an actual test cannot deviate from the level established during the presetting procedure. This is made possible by virtue of the fact that the static trip unit power supply is not powered up from the test set during the presetting procedure and thus is not current stressed while the test signal current is being preset to the desired test level. It should also be noted that the operability of the static trip unit can be fully verified by the test set independently of the circuit breaker. That is, the test set need not be plugged into the circuit breaker in order to test the overcurrent and ground fault trip capabilities of the trip unit.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. A field test set for circuit breakers having phase current monitoring current transformers normally individually connected to supply phase current signals to separate phase signal inputs of a static trip unit for processing to determine the existence of an overcurrent condition, the trip unit including a power supply connected to the phase signal inputs for deriving trip unit operating power from the phase current signals and further including an output connected to supply tripping current for energizing a trip solenoid pursuant to initiating a trip function, said test set including, in combination:

A. a variable source of test signal current;
    B. a current meter;
    C. a calibration circuit connected to receive said test signal current and having a voltage divider network developing a test signal voltage proportional to said test signal current for application to said current meter;
    D. test selector switch means operating to selectively route said test signal current from said calibrating circuit to one of the trip unit phase signal inputs;
    E. a power source supplying test power current to directly power up the trip unit power supply independently of the phase signal inputs; and
    F. test logic circuitry operating to signal a successful execution of a test trip function in response to the receipt of an effective magnitude of tripping current generated at the trip unit output, said test logic circuitry further operating to coordinate the application of said test signal current and said test power current to the trip unit.

2. The test set defined in claim 1, which further includes an elapsed time meter operating under the control of said test logic circuitry for indicating the time interval from the initial application of said test signal current to the trip unit to the successful execution of a test trip function.

3. The test set defined in claim 1, which further includes overcurrent lockout circuitry for monitoring the application of test signal current to the trip unit, said lockout circuitry operating when the level and duration of said test signal current exceed predetermined limits to automatically impose a lockout restraint on said test logic circuitry, whereby said test logic circuitry terminates the application of said test signal current to the trip unit.

4. The test set defined in claim 3, wherein said overcurrent lockout circuitry includes a timing circuit for sustaining said lockout restraint on said test logic circuitry for a predetemined time duration following the termination of said test signal current.

5. The test set defined in claim 1, which further includes a phase current monitoring current transformer continuity check circuit selectively connectable to each of the circuit breaker current transformers and operating to check the electrical continuity thereof.

6. The test set defined in claim 1, wherein the trip unit further includes a differential current transformer having separate primary windings connected to be energized by the phase current signals and a secondary winding connected to supply a ground fault signal current to the trip unit in the event of an imbalance in the phase current signals, said test selector switch means being operable to route said test signal current to a primary winding of the trip unit differential current transformer to create a current imbalance and thereby verify the response of the trip unit to a ground fault signal current input.

7. The test set defined in claim 6, wherein the circuit breaker includes a neutral current monitoring current transformer normally connected to supply a neutral current signal to a neutral primary winding of the differential current transformer, said test selector switch means operable to route said test signal current through the neutral primary winding in verifying the trip unit response to a ground fault signal input.

8. The test set defined in claim 1, wherein said test logic circuitry includes timing circuit means operating to delay the application of said test signal current to said trip unit for a predetermined time following the application of said test power current to said trip unit, whereby the trip unit is powered up and capable of immediate response to the initial application thereto of said test signal current.

9. The test set defined in claim 1, wherein said test logic circuitry includes:
 (1) a start switch,
 (2) a first relay having contacts controlling the application of test power current to the trip unit,
 (3) a second relay having contacts controlling the application of test signal current to the trip unit,
 (4) first means responsive to the closure of said start switch for initiating activation of said first relay, thereby conditioning its contacts to initiate the application of test power current to the trip unit, and
 (5) second means responsive to the activation of said first relay for initiating activation of said second relay after a predetermined delay, whereupon said contacts of said second relay are conditioned to initiate the application of test signal current to the trip unit.

10. The test set defined in claim 9, wherein said test logic circuitry further includes:
 (1) a preset current switch operable to, in turn, render said second means operable to initiate application of said test signal current to the trip unit without prior activation of said first relay, thereby permitting adjustment of said variable source to establish a desired level of test signal current while the trip unit is unpowered.

11. The test set defined in claim 9, wherein said test logic circuitry further includes a level detecting circuit responsive to trip unit tripping current exceeding a predetermined level for deactivating said first and second relays pursuant to terminating the application of said test signal and test power currents to the trip unit.

12. The test set defined in claim 11, wherein said test logic circuitry further includes a selector switch operable in a first position to route the trip unit tripping current solely to said level detecting circuit and in a second position to route the trip unit tripping current to said level detecting circuit via the circuit breaker trip solenoid.

13. The test set defined in claim 11, which further includes an elapsed time meter, said second relay having additional contacts enabling the energization of said elaspsed time meter while said second relay is activated.

14. The test set defined in claim 11, which further includes overcurrent lockout circuitry monitoring the application of test signal current to the trip unit, said lockout circuitry operating, when the level and duration of said test signal current exceeds predetermined limits, to disable said first and second means and thereby deactivate said first and second relays, and said lockout circuitry including a timing circuit for sustaining the disablement of said first and second means for a predetermined limited duration.

15. The test set defined in claim 11, which further includes a phase current monitoring current transformer continuity check circuit selectively connectable to each of the circuit breaker current transformers and operating to check the electrical continuity thereof.

16. The test set defined in claim 11, wherein said test signal voltage developed in said calibrating circuit is effective in calibrating said current meter to read in multiples of the established continuous current rating of the trip unit.

17. The test set defined in claim 16, wherein said voltage divider network is adjustable to accommodate various, selectively established trip unit continuous current ratings.

* * * * *

UNITED STATES PATENT OFFICE
CERTIFICATE OF CORRECTION

PATENT NO. : 4,105,965
DATED : August 8, 1978
INVENTOR(S) : Ronald R. Russell

It is certified that error appears in the above-identified patent and that said Letters Patent are hereby corrected as shown below:

Column 1, line 64, after the word "trip" insert --unit--.

Column 2, line 52, after the word FIG., change "1" to --2--.

Column 4, line 17, change "terminal" to --terminals--.

Column 8, line 50, change "powr" to --power--.

Column 10, line 59, change "Kc" to --K1c--.

Column 12, line 30, change "fullwave" to --full-wave--.

Column 12, line 67, after "Q5" insert --whose--.

Column 14, line 51, change "fullwave" to --full-wave--.

Column 14, line 52, change "and" to --the--.

Signed and Sealed this

Twenty-third Day of January 1979

[SEAL]

Attest:

RUTH C. MASON
Attesting Officer

DONALD W. BANNER
Commissioner of Patents and Trademarks